United States Patent
Derner et al.

(10) Patent No.: US 6,903,957 B2
(45) Date of Patent: *Jun. 7, 2005

(54) HALF DENSITY ROM EMBEDDED DRAM

(75) Inventors: Scott Derner, Meridian, ID (US); Casey Kurth, Eagle, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/863,070

(22) Filed: Jun. 8, 2004

(65) Prior Publication Data

US 2004/0233741 A1 Nov. 25, 2004

Related U.S. Application Data

(63) Continuation of application No. 10/017,658, filed on Dec. 12, 2001, now Pat. No. 6,747,889.

(51) Int. Cl.[7] .................................................. G11C 17/00
(52) U.S. Cl. ........................ 365/94; 365/104; 365/149
(58) Field of Search .......................... 365/94, 102, 103, 365/104, 149, 190

(56) References Cited

U.S. PATENT DOCUMENTS

| | | | |
|---|---|---|---|
| 4,575,819 A | 3/1986 | Amin | 365/104 |
| 4,855,803 A | 8/1989 | Azumai et al. | 357/45 |
| 5,053,648 A | 10/1991 | van den Elshout et al. | 326/45 |
| 5,148,391 A | 9/1992 | Zagar | 365/96 |
| 5,270,241 A | 12/1993 | Dennison et al. | 438/396 |
| 5,351,213 A | 9/1994 | Nakashima | 365/201 |
| 5,388,076 A | 2/1995 | Ihara | 365/200 |
| 5,418,739 A | 5/1995 | Takasugi | 365/149 |
| 5,526,302 A | 6/1996 | Takasugi | 365/149 |
| 5,732,013 A | 3/1998 | Von Basse et al. | 365/104 |
| 5,757,690 A | 5/1998 | McMahon | 365/104 |
| 5,831,892 A | 11/1998 | Thewes et al. | 365/94 |
| 5,900,008 A | 5/1999 | Akao et al. | 711/100 |
| 5,917,744 A | 6/1999 | Kirihata et al. | 365/63 |
| 5,961,653 A | 10/1999 | Kalter et al. | 714/7 |
| 5,966,315 A | 10/1999 | Muller et al. | 365/51 |
| 5,982,682 A | 11/1999 | Nevill et al. | 365/201 |
| 5,995,409 A | 11/1999 | Holland | 365/149 |
| 6,134,137 A | 10/2000 | Kurth et al. | 365/149 |
| 6,154,864 A | 11/2000 | Merritt | 714/738 |
| 6,243,285 B1 | 6/2001 | Kurth et al. | 365/149 |
| 6,266,272 B1 | 7/2001 | Kirihata et al. | 365/185.08 |
| 6,545,899 B1 | 4/2003 | Derner et al. | 365/94 |

*Primary Examiner*—Tan T. Nguyen
(74) *Attorney, Agent, or Firm*—Leffert Jay & Polglaze, P.A.

(57) ABSTRACT

A half-density ROM embedded DRAM uses hard programmed non-volatile cells and unprogrammed dynamic cells. By hard programming either a first or second memory cell in a pair of cell, different data states are stored. Two word lines are used to access the memory cell pair. Because one of the cells is hard programmed, sense amplifier circuitry identifies the appropriate data state. The ROM cell can be programmed in numerous different manners. For example, ROM cells can be hard programmed by eliminating cell dielectric to short cell plates to a program voltage, or an electrical plug can be fabricated between the cell plates and shorted to a program voltage. In other embodiments, the ROM cell can be programmed using an anti-fuse programming technique, or by providing a high leakage path (not full short) such as through an active area to the substrate.

27 Claims, 2 Drawing Sheets

HALF DENSITY ROM EMBEDDED DRAM

RELATED APPLICATIONS

This is a continuation application of U.S. Ser. No. 10/017,658) filed Dec. 12, 2001 (now U.S. Pat. No. 6,747,889, issued Jun. 8, 2004).

TECHNICAL FIELD OF THE INVENTION

The present invention relates generally to memory devices and in particular the present invention relates to read only memory (ROM) embedded in a dynamic random access memory (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Frequently, as in the case of microprocessors, microcontrollers, and other application specific integrated circuitry (ASICs), it is desired to incorporate read only memory (ROM) together with or in addition to RAM on a single semiconductor wafer. This typically requires the formation of separate additional peripheral circuitry and interconnects for the ROM. The ROM cells and additional circuitry require additional semiconductor wafer space and fabrication process steps that increase the overall costs of device fabrication.

A read only memory (ROM) consists of an array of semiconductor devices (diodes, bipolar or field-effect transistors), which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit, which is expensive and feasible only when a large quantity of the same data array is required. EPROMs use a special charge-storage mechanism to enable or disable the switching elements in the memory array. In this case, appropriate voltage pulses to store electrical charges at the memory array locations are provided. The data stored in this manner is generally permanent until it is erased using ultraviolet light allowing it to once again be programmed. PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each cross-over point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data that the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

Like RAM cells, ROM cells need to store either a data 1 or a data 0. Processing factors, however, may limit the ROM cell to only one program state. For the reasons stated above, and for other reasons stated below which will become apparent to those skilled in the art upon reading and understanding the present specification, there is a need in the art for a ROM-embedded-DRAM which can be fabricated with single state ROM cells.

SUMMARY OF THE INVENTION

The above-mentioned problems with ROM-embedded-DRAM and other problems are addressed by the present invention and will be understood by reading and studying the following specification.

In one embodiment, a memory device comprises a read only memory (ROM) cell hard programmed to a first data state, a dynamic memory cell, and access circuitry to couple the ROM cell and the dynamic memory cell to differential digit lines.

In another embodiment, a half-density read only memory (ROM) embedded dynamic random access memory (DRAM) device comprises a DRAM array comprising first dynamic memory cells, a ROM array comprising hard programmed non-volatile memory cells and second dynamic memory cells. Sense amplifier circuitry is coupled to differential digit lines of the ROM array and word lines to access rows of the memory ROM array. Access circuitry couples one of the non-volatile memory cells and one of the second dynamic memory cells to the differential digit lines in response to a pair of word line signals.

A method of operating a read-only memory comprises programming a first memory cell in a non-volatile manner to a first data state, providing an un-programmed volatile memory cell, and accessing both the first and second memory cell capacitors in response to word line signals.

DETAILED DESCRIPTION OF THE INVENTION

Figure 1:
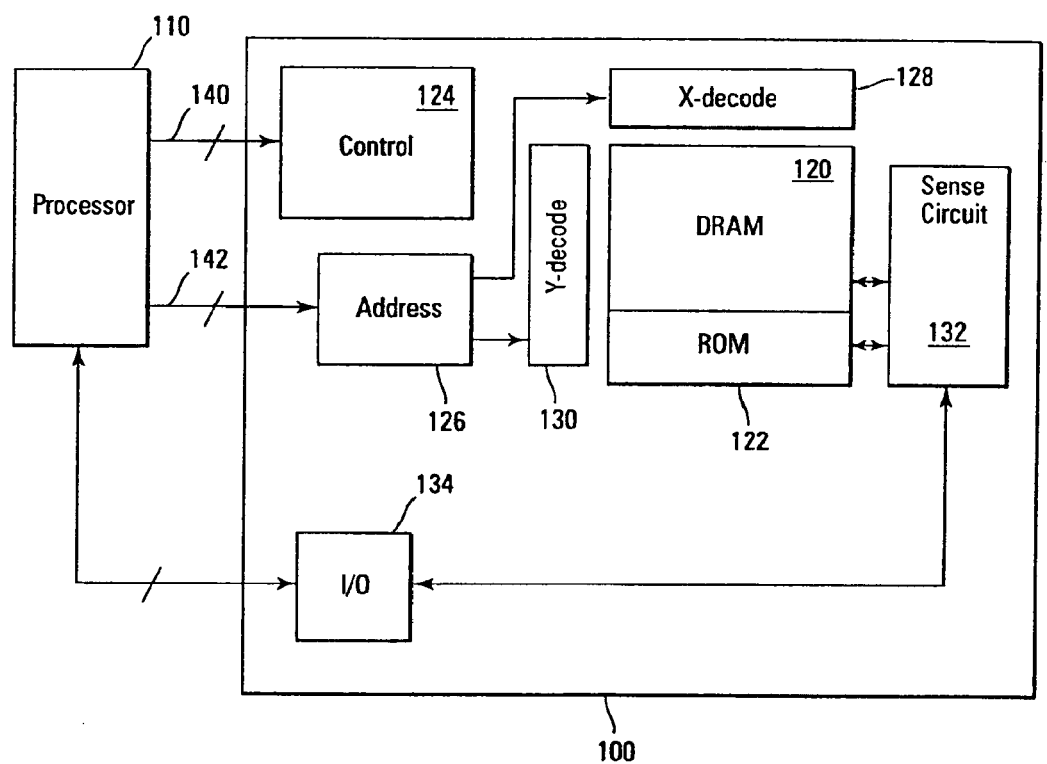
FIG. 1 is a simplified block diagram of a ROM embedded DRAM of an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Referring to FIG. 1, a simplified block diagram of a ROM embedded DRAM 100 of the present invention is described. The memory device can be coupled to a processor 110 for bi-directional data communication. The memory includes an array of memory cells 112. The array includes a dynamic (DRAM) portion 120 and a read only (ROM) portion 122. The ROM array is "embedded" in the dynamic memory and may include some dynamic cells. Control circuitry 124 is provided to manage data storage and retrieval from the array in response to control signals 140 from the processor. Address circuitry 126, X-decoder 128 and Y-decoder 130 analyze address signals 142 and storage access locations of the array. Sense circuitry 132 is used to read data from the array and couple output data to I/O circuitry 134. The I/O circuitry operates in a bi-directional manner to receive data from processor 110 and pass this data to array 112. It is noted that the sense circuitry may not be used in some embodiments to store the input data.

Dynamic memories are well known, and those skilled in the art will appreciate that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory.

One technique for physically programming ROM embedded cells is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to Vcc or Vss by shorting the cell to wordlines. The memory reads the ROM cells in a manner that is identical to reading the DRAM cells. As described below, the present invention provides an improved ROM embedded DRAM.

As explained above, conventional ROM devices program two data states, logic 1 and 0. When the memory cells are read, therefore, both data states are readily available. In contrast, the present invention provides a combination ROM and DRAM memory device. The ROM memory cells can be programmed to only one data state. This is accomplished by shorting selected ROM cells to one voltage to remain programmed in a non-volatile manner.

Figure 2A:
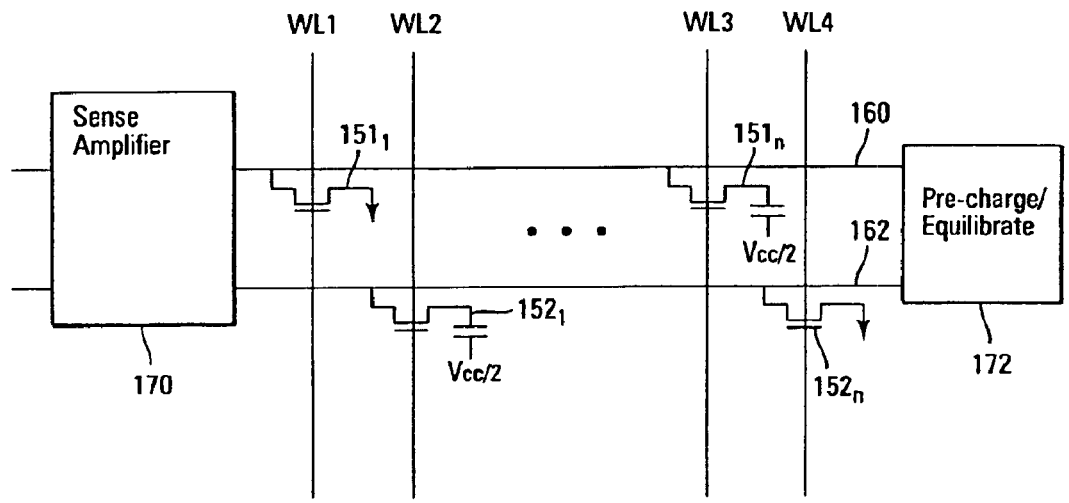
FIG. 2A illustrates a pair of complementary digit lines of an embodiment of the memory of FIG. 1.

Referring to FIG. 2A, a simplified schematic diagram of an embodiment of the present invention is described. The memory includes dynamic memory cells 151 and 152 that can be selectively coupled to complimentary digit lines 160 and 162. The digit lines can be electrically coupled to sense amplifier circuitry 170 to detect a voltage differential between the digit lines. Additionally, a pre-charge/equilibrate circuit 172 can be provided to balance the digit lines to a predetermined voltage, such as Vcc/2. Memory cells are hard programmed, as explained below, to operate as a non-volatile ROM cells.

Numerous methods are available to program the ROM cells. For example, U.S. Pat. No. 6,134,137 issued Oct. 17, 2000 entitled "ROM-EMBEDDED-DRAM" describes ROM cells that are fabricated to short the memory cell to either its wordline of an adjacent wordline. Shorting the memory cell to its wordline results in reading a logic one (Vcc). Shorting the memory cell to an adjacent wordline results in reading a logic zero (Vss). Shorting a cell to its own wordline, however, may result in a digit line to wordline short during fabrication. As such, hard programming logic zeros may only be possible for some fabrication layouts. The hard programming technique of U.S. Pat. No. 6,134,137 is an example of a technique for programming ROM cells using a DRAM fabrication. Other techniques for programming a ROM cell using a DRAM fabrication can be used without departing from the present invention. For example, ROM cells can be hard programmed by eliminating cell dielectric so that the cell plates are shorted to a program voltage, an electrical plug can be fabricated between the cell plates and shorted to a program voltage, the ROM cell can be programmed using an anti-fuse programming technique, the ROM cells can also be programmed by providing a high leakage path (not full short) such as through an active area to the substrate.

The embodiment of FIG. 2A uses two memory cells 151 and 152 to store a bit of data. One of the memory cells is a hard programmed ROM cell and the second cell is a dynamic cell, such as a non-programmed ROM bit that had to be skipped because the ROM cells are only programmed to one polarity. As a result, half of the cells in the ROM portion of the array are skipped in order to use the Half Density option to store ROM bits that represent both "1" and "0" data states. Thus, the ROM cell can be programmed to provide either a logic one or a logic zero. For example, memory cell $151_1$ and memory cell $152_n$ are hard programmed to ground (Vss). In operation, word lines WL1 and WL2 are activated together to access both memory cell $151_1$ and $152_1$. In response, digit line 160 is pulled to ground and digit line 162 remains at the precharge level, Vcc/2. The sense amplifier detects this differential between the digit lines and provides a logic one output. In contrast, when word lines WL3 and WL4 are activated, digit line 162 is pulled to ground and digit line 160 remains at the precharge level, Vcc/2. The sense amplifier detects this differential between the digit lines and provides a logic zero output.

Figure 2B:
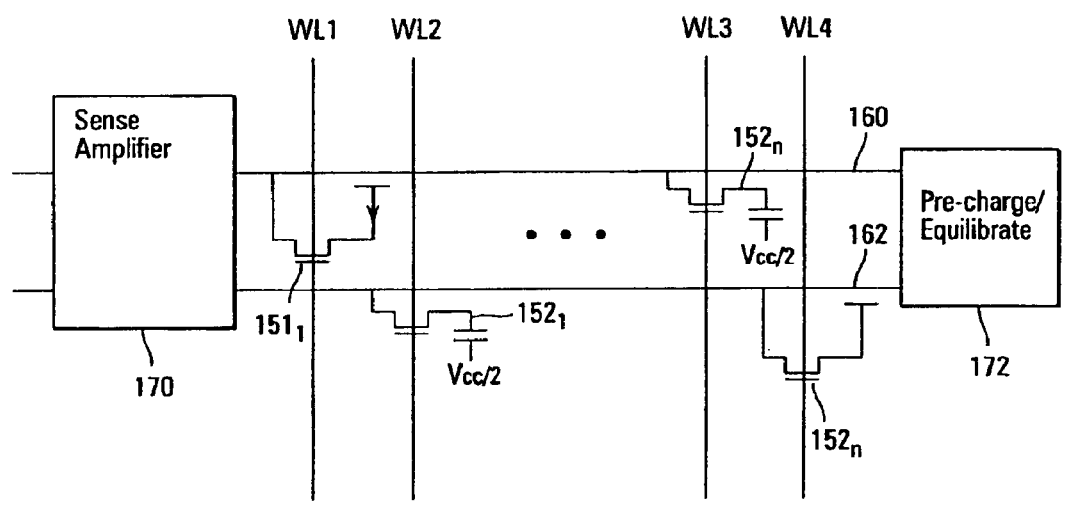
FIG. 2B illustrates a pair of complementary digit lines of another embodiment of the memory of FIG. 1.

The embodiment of FIG. 2B uses two memory cells 151 and 152 to store a bit of data. One of the memory cells is a hard programmed ROM cell and the second cell is a dynamic cell, such as DRAM capacitor cell. The ROM cell can be programmed to provide either a logic one or a logic zero. For example, memory cell $151_1$ and memory cell $152_n$ are hard programmed to Vcc. In operation, word lines WL1 and WL2 are activated together to access both memory cell $151_1$ and $152_1$. In response, digit line 160 is pulled to Vcc and digit line 162 remains at the precharge level, Vcc/2. The sense amplifier detects this differential between the digit lines and provides a logic one output. In contrast, when word lines WL3 and WL4 are activated, digit line 162 is pulled to Vcc and digit line 160 remains at the precharge level, Vcc/2. The sense amplifier detects this differential between the digit lines and provides a logic zero output.

CONCLUSION

A half-density ROM embedded DRAM has been described. The memory provides ROM cells that can be programmed to a single state. By hard programming either a first or second memory cell in a pair of cell, different data states are stored. Two word lines are used to access the memory cell pair. Because one of the cells is hard programmed, sense amplifier circuitry identifies the appropriate data state. The ROM cell can be programmed in numerous different manners. For example, ROM cells can be hard programmed by eliminating cell dielectric to short cell plates to a program voltage, or an electrical plug can be fabricated between the cell plates and shorted to a program voltage. In other embodiments, the ROM cell can be programmed using an anti-fuse programming technique, or by providing a high leakage path (not full short) such as through an active area to the substrate.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A read only memory (ROM) embedded dynamic random access memory (DRAM) device, comprising:
   a DRAM array comprising first volatile memory cells; and
   a half density ROM array comprising:
      a plurality of memory cell pairs arranged in rows and columns, each memory cell pair comprising a hard programmed non-volatile cell and an unprogrammed volatile cell;
      a plurality of word line pairs, each word line pair connected to a row of the plurality of memory cell pairs, a first word line connected to access the hard programmed non-volatile cell and a second word line connected to access the unprogrammed volatile cell;
      a plurality of complementary digit line pairs;
      sense amplifier circuitry coupled to the plurality of digit line pairs, each digit line pair connected to couple a column of the plurality of memory cell pairs to the sense circuitry, a first digit line of the digit line pair connected to the hard programmed memory cell and a second digit line of the digit line of the pair connected to the unprogrammed dynamic memory cell; and
      access circuitry to couple one of the non-volatile memory cells and one of the second dynamic memory cells to the differential digit lines in response to a pair of word line signals.

2. The ROM embedded DRAM of claim 1, wherein the access circuitry for each of the plurality of memory cell pairs comprises:
   a first transistor coupled between its respective non-volatile cell and its respective first digit line; and
   a second transistor coupled between its respective volatile memory cell and its respective second digit line, wherein gate connections of the first and second transistors are coupled to their respective first and second word lines.

3. The ROM embedded DRAM of claim 1, wherein each non-volatile cell is programmed to Vcc.

4. The ROM embedded DRAM of claim 1, wherein each non-volatile cell is programmed to Vss.

5. A half-density read only memory (ROM) embedded dynamic random access memory (DRAM) device comprising:
   a DRAM array comprising first dynamic memory cells;
   a ROM array comprising hard programmed non-volatile memory cells and second dynamic memory cells;
   sense amplifier circuitry coupled to differential digit lines of the ROM array;
   word lines to access rows of the memory ROM array; and access circuitry to couple one of the non-volatile memory cells and one of the second dynamic memory cells to the differential digit lines in response to a pair of word line signals;

wherein the ROM cell is a capacitor cell hard programmed using an electrical potential to short a dielectric layer of the ROM cell.

6. The ROM embedded DRAM of claim 5, wherein the access circuitry comprises:

a first transistor coupled between the ROM cell and a first digit line; and a second transistor coupled between the dynamic memory cell and a second digit line, wherein gate connections of the first and second transistors are coupled to different word lines.

7. A half-density read only memory (ROM) embedded dynamic random access memory (DRAM) device comprising:

a DRAM array comprising first dynamic memory cells;

a ROM array comprising hard programmed non-volatile memory cells and second dynamic memory cells;

sense amplifier circuitry coupled to differential digit lines of the ROM array;

word lines to access rows of the memory ROM array; and access circuitry to couple one of the non-volatile memory cells and one of the second dynamic memory cells to the differential digit lines in response to a pair of word line signals;

wherein the ROM cell is a capacitor cell hard programmed using a physical conductor fabricated between capacitor plates of the ROM cell.

8. The ROM embedded DRAM of claim 7, wherein the access circuitry comprises:

a first transistor coupled between the ROM cell and a first digit line; and a second transistor coupled between the dynamic memory cell and a second digit line, wherein gate connections of the first and second transistors are coupled to different word lines.

9. A half-density read only memory (ROM) embedded dynamic random access memory (DRAM) device comprising:

a DRAM array comprising first dynamic memory cells;

a ROM array comprising hard programmed non-volatile memory cells and second dynamic memory cells;

sense amplifier circuitry coupled to differential digit lines of the ROM array;

word lines to access rows of the memory ROM array; and access circuitry to couple one of the non-volatile memory cells and one of the second dynamic memory cells to the differential digit lines in response to a pair of word line signals;

wherein the ROM cell is a capacitor cell hard programmed using a high leakage path from a storage node of the ROM cell.

10. The ROM embedded DRAM of claim 9, wherein the access circuitry comprises:

a first transistor coupled between the ROM cell and a first digit line; and a second transistor coupled between the dynamic memory cell and a second digit line, wherein gate connections of the first and second transistors are coupled to different word lines.

11. A half-density read only memory (ROM) embedded dynamic random access memory (DRAM) device comprising:

a DRAM array comprising first dynamic memory cells;

a ROM array comprising hard programmed non-volatile memory cells and second dynamic memory cells;

sense amplifier circuitry coupled to differential digit lines of the ROM array;

word lines to access rows of the memory ROM array; and access circuitry to couple one of the non-volatile memory cells and one of the second dynamic memory cells to the differential digit lines in response to a pair of word line signals;

wherein the ROM cell is a capacitor cell hard programmed using a physical short between a storage node of the ROM cell to receive a voltage signal.

12. The ROM embedded DRAM of claim 11, wherein the access circuitry comprises:

a first transistor coupled between the ROM cell and a first digit line; and a second transistor coupled between the dynamic memory cell and a second digit line, wherein gate connections of the first and second transistors are coupled to different word lines.

13. A read only memory (ROM) embedded dynamic random access memory (DRAM) array, comprising:

a DRAM array of volatile memory cells; and a ROM array of memory cells, the ROM array comprising:

a plurality of memory cell pairs, each memory cell pair comprising a first hard programmed memory cell and an unprogrammed dynamic memory cell;

a plurality of word line pairs, each word line pair connected to one of the plurality of memory cell pairs, one word line of the pair to the hard programmed memory cell and the other word line of the pair to the unprogrammed dynamic memory cell; and a plurality of complementary digit line pairs coupled to sense circuitry and to the plurality of memory cell pairs, one digit line of the pair to the hard programmed memory cell and the other digit line of the pair to the unprogrammed dynamic memory cell.

14. A memory device comprising:

an array of memory cells;

control circuitry to read, write and erase the memory cells; and address circuitry to latch address signals provided on address input connections; wherein the array of memory cells comprises:

a plurality of memory cell pairs, each memory cell pair comprising a first hard programmed memory cell and an unprogrammed dynamic memory cell;

a plurality of word line pairs, each word line pair selectively coupled to one of the plurality of memory cell pairs, one word line of the pair to the hard programmed memory cell and the other word line of the pair to the unprogrammed dynamic memory cell;

a plurality of complementary digit line pairs; and sense circuitry coupled to the plurality of digit line pairs and selectively coupled to the plurality of memory cell pairs, one digit line of the pair to the hard programmed memory cell and the other digit line of the pair to the unprogrammed dynamic memory cell.

15. A processing system, comprising:

a processor; and a memory device coupled to the processor to store data provided by the processor and to provide data to the processor, the memory comprising:

an array of memory cells; and control circuitry to read, write and erase the memory cells;

address circuitry to latch address signals provided on address input connections;
wherein the array of memory cells comprises:
  a plurality of memory cell pairs, each memory cell pair comprising a first hard programmed memory cell and an unprogrammed dynamic memory cell;
  a plurality of word line pairs, each word line pair connected to one of the plurality of memory cell pairs, one word line of the pair to the bard programmed memory cell and the other word line of the pair to the unprogrammed dynamic memory cell;
  a plurality of complementary digit line pairs; and
  sense circuitry coupled to the plurality of digit line pairs and selectively coupled to the plurality of memory cell pairs, one digit line of the pair to the hard programmed memory cell and the other digit line of the pair to the unprogrammed dynamic memory cell.

16. A half-density read only memory (ROM) comprising:
  an array of ROM cells arranged in rows and columns, each ROM cell comprising first and second memory cells, the first memory cell programmed in a non-volatile manner to a first voltage and the second memory cell an unprogrammed volatile memory cell; and
  a plurality of word line pairs, each word line pair connected to one of the plurality of memory cell pairs, one word line of the pair to the hard programmed memory cell and the other word line of the pair to the unprogrammed dynamic memory cell;
  a plurality of complementary digit line pairs coupled to sense circuitry and to the plurality of memory cell pairs, one digit line of the pair to the hard programmed memory cell and the other digit line of the pair to the unprogrammed dynamic memory cell.
  access circuitry coupled to read each ROM cell, wherein the access circuitry electrically couples the first and second memory cells to differential sensing circuitry.

17. A method of operating a read-only memory comprising:
  providing a memory cell pair to store a single bit of information, the memory cell pair comprising a first non-volatile memory cell, and a second volatile memory cell;
  programming the first non-volatile memory cell in a non-volatile manner to a first data state;
  maintaining the second volatile memory cell in an unprogrammed state; and
  accessing both the first and second memory cells in response to word line signals.

18. The method of claim 17, wherein programming the non-volatile memory cell comprises using an electrical potential to short a dielectric layer of the non-volatile memory cell.

19. The method of claim 17, wherein programming the non-volatile memory cell comprises using a physical conductor fabricated between capacitor plates of the non-volatile cell.

20. The method of claim 17, wherein programming the non-volatile memory cell comprises using a high leakage path from a storage node of the non-volatile cell.

21. The method of claim 17, wherein programming the non-volatile memory cell comprises using a physical short between a storage node of the non-volatile memory cell to receive a voltage signal.

22. A method of fabricating a ROM embedded DRAM array, comprising:
  providing a plurality of memory cell pairs, each memory cell pair comprising a first hard programmed memory cell and an unprogrammed dynamic memory cell;
  providing a plurality of word line pairs, each word line pair connected to one of the plurality of memory cell pairs, one word line of the pair to the hard programmed memory cell and the other word line of the pair to the unprogrammed dynamic memory cell;
  providing a plurality of complementary digit line pairs coupled to sense circuitry and to the plurality of memory cell pairs, one digit line of the pair to the hard programmed memory cell and the other digit line of the pair to the unprogrammed dynamic memory cell.

23. A method of operating a ROM embedded DRAM memory, comprising:
  providing a DRAM array comprising first volatile memory cells;
  providing a ROM array having memory cell pairs arranged in rows and columns, each memory cell pair having a first memory cell programmed in a non-volatile manner and a second volatile unprogrammed memory cell; and
  programming each non-volatile first memory cell to a first data state;
  connecting a first word line of one of a plurality of word line pairs to selectively couple the first word line to the non-volatile programmed memory cell of its memory cell pair and connecting a second word line of the one of the plurality of word line pairs to selectively couple the second word line to the unprogrammed volatile memory cell; and
  coupling a plurality of complementary digit line pairs to sense circuitry and selectively coupling the plurality of complementary digit line pairs to the plurality of memory cell pairs, one digit line of the pair to the non-volatile memory cell and the other digit line of the pair to the unprogrammed volatile memory cell.

24. The method of claim 23, and further comprising:
  sensing a differential between the pair of complementary digit lines to provide a logic zero output or a logic one output depending on which digit line is coupled to the non-volatile programmed memory cell.

25. The method of claim 24, wherein sensing provides a logic one output when the non-volatile programmed memory cell is programmed to Vss and is coupled to the first bitline, and provides a logic zero output when the non-volatile programmed memory cell is programmed to Vss and is coupled to the second bitline.

26. The method of claim 24, wherein sensing provides a logic one output when the non-volatile programmed memory cell is programmed to Vcc and is coupled to the first bitline, and provides a logic zero output when the non-volatile programmed memory cell is programmed to Vcc and is coupled to the second bitline.

27. A method of operating a read only memory (ROM) embedded dynamic random access memory (DRAM) device, comprising:
  providing a ROM embedded DRAM array having an array of memory cell pairs each comprising a hard programmed memory cell and a dynamic volatile memory cell, each hard programmed memory cell paired with a dynamic volatile memory cell on complementary digit lines and on a pair of word lines, one cell on a first digit line and a first word line, and the other cell on a second complementary digit line and a second word line; and
  sensing a data state of with sensing circuitry in response to signals on the word lines.

* * * * *

UNITED STATES PATENT AND TRADEMARK OFFICE
CERTIFICATE OF CORRECTION

PATENT NO. : 6,903,957 B2
DATED : June 7, 2005
INVENTOR(S) : Derner, Scott et al.

It is certified that error appears in the above-identified patent and that said Letters Patent is hereby corrected as shown below:

Column 9,
Line 9, "word line of the pair to the bard programmed memory" should read -- word line of the pair to the hard programmed memory --.

Signed and Sealed this

Twenty-eighth Day of March, 2006

JON W. DUDAS
*Director of the United States Patent and Trademark Office*